(12) United States Patent
Ishii et al.

(10) Patent No.: US 7,566,833 B2
(45) Date of Patent: *Jul. 28, 2009

(54) WIRED CIRCUIT BOARD AND PRODUCTION METHOD THEREOF

(75) Inventors: Jun Ishii, Osaka (JP); Yasuhito Funada, Osaka (JP); Yasunari Ooyabu, Osaka (JP)

(73) Assignee: Nitto Denko Corporation, Osaka (JP)

( * ) Notice: Subject to any disclaimer, the term of this patent is extended or adjusted under 35 U.S.C. 154(b) by 157 days.

This patent is subject to a terminal disclaimer.

(21) Appl. No.: 11/439,307

(22) Filed: May 24, 2006

(65) Prior Publication Data

US 2006/0269730 A1 Nov. 30, 2006

(30) Foreign Application Priority Data

May 30, 2005 (JP) .............................. 2005-157755

(51) Int. Cl.
*H05K 1/00* (2006.01)
(52) U.S. Cl. ....................... 174/254; 174/261
(58) Field of Classification Search ................. 174/250, 174/264, 255, 260, 261, 254
See application file for complete search history.

(56) References Cited

U.S. PATENT DOCUMENTS

| | | | |
|---|---|---|---|
| 5,597,496 A | * | 1/1997 | Masaichi et al. ............... 216/94 |
| 6,316,734 B1 | * | 11/2001 | Yang .......................... 174/256 |
| 6,459,043 B1 | * | 10/2002 | Dodsworth ................... 174/254 |
| 6,801,402 B1 | * | 10/2004 | Subrahmanyam et al. ....................... 360/245.9 |
| 6,995,954 B1 | * | 2/2006 | Coon ....................... 360/245.9 |
| 2003/0089520 A1 | | 5/2003 | Ooyabu et al. |
| 2004/0221447 A1 | | 11/2004 | Ishii et al. |

FOREIGN PATENT DOCUMENTS

| | | |
|---|---|---|
| JP | H08-153940 | 6/1996 |
| JP | 2003-152383 A | 5/2003 |
| JP | 2004-335700 A | 11/2004 |

OTHER PUBLICATIONS

Claims of U.S. Appl. No. 11/713,053, amended as of Aug. 29, 2008 (copy not attached).*

* cited by examiner

*Primary Examiner*—Ishwar (I. B.) Patel
(74) *Attorney, Agent, or Firm*—Jean C. Edwards, Esq.; Akerman Senterfitt

(57) ABSTRACT

A wired circuit board that can remove static electricity not only from an insulating base layer and an insulating cover layer but also from a terminal portion, to effectively prevent an electronic component mounted from being damaged by static electricity and also prevent stripping of a semi-conductive layer. In a suspension board with circuit including an insulating base layer formed on a metal supporting board, a conductive pattern formed on the insulating base layer, and an insulating cover layer, formed on the insulating cover layer, to cover the conductive pattern and form an opening, semi-conductive layer is formed in succession on an upper surface of the insulating base layer covered with the insulating cover layer, on a lateral side surface and an upper surface of the conductive pattern, and on a lateral side surface of the insulating base layer adjacent to the metal supporting board.

2 Claims, 8 Drawing Sheets

1B

1C (a)

(b)

(c)

(d)

(e)

(f)

(g)

(h)

(i)

(j)

(k)

WIRED CIRCUIT BOARD AND PRODUCTION METHOD THEREOF

CROSS-REFERENCE TO RELATED APPLICATIONS

This application claims priority from Japanese Patent Appln. No. 2005-157755, filed May 30, 2005, the contents of which are herein incorporated by reference in their entirety.

BACKGROUND OF THE INVENTION

1. Field of the Invention

The present invention relates to a wired circuit board and to a production method thereof. More particularly, the present invention relates to a wired circuit board for mounting an electronic component thereon and to a production method thereof.

2. Description of the Related Art

In general, in the wired circuit board, such as a flexible wired circuit board and a suspension board with circuit, a conductive pattern of a copper foil and the like is formed on an insulating base layer of a polyimide resin, and an insulating cover layer formed of a polyimide resin is formed on the base insulating layer, to cover the conductive pattern. The wired circuit boards of this type are widely used in a variety of fields of electric and electronic equipment.

When an electronic component is mounted on this wired circuit board, the electronic component is sometimes damaged by static electricity in the mounting process.

The prior art has proposed an attempted solution, according to which for example in a flexible circuit board, a metal layer is formed on a surface of a base film or a coverlay film by vapor deposition, sputtering, or electroless plating (Cf. JP Laid-open (Unexamined) Patent Publication No. Hei 8-153940, for example).

Meanwhile, the wired circuit board has a terminal portion for mounting an electronic component. The terminal portion is formed as an exposed portion of the conductive pattern which is formed by opening the insulating cover layer so that the conductive pattern can be exposed from the opening.

In the mounting process of the electronic component, there are occasions when a certain quantity of static electricity is carried on the terminal portion (i.e., the exposed portion of the conductive pattern) as well. When the static electricity is carried on the terminal portion, there is a possibility that an electronic component mounted on the terminal portion may be damaged by the static electricity.

In the flexible circuit board described in JP Laid-open (Unexamined) Patent Publication No. Hei 8-153940, the static electricity on the base film or coverlay film on which the metal layer is formed can be removed therefrom, but the static electricity on the terminal portion cannot be removed therefrom. Thus, the prior art fails to take sufficient measures to prevent the electronic component susceptible to static electricity from the damage by the static electricity.

Also, in the flexible circuit board described in JP Laid-open (Unexamined) Patent Publication No. Hei 8-153940 cited above, since the metal layer is formed on the surface of the base film or coverlay film, there is a possibility that when a part of the metal layer is stripped, it may scatter from the flexible circuit board as a foreign matter.

SUMMARY OF THE INVENTION

It is an object of the invention to provide a wired circuit board that can remove static electricity not only from an insulating base layer and an insulating cover layer but also from a terminal portion, to effectively prevent an electronic component mounted from being damaged by static electricity and also prevent stripping of a semi-conductive layer.

The present invention provide a novel wired circuit board comprising a metal supporting board, an insulating base layer formed on the metal supporting board, a conductive pattern formed on the insulating base layer, a semi-conductive layer which is formed on the insulating base layer exposed from the conductive pattern and at least a part of which contacts with the metal supporting board and the conductive pattern, an insulating cover layer, formed on the semi-conductive layer formed on the insulating base layer, to cover the conductive pattern, and a terminal portion formed by the conductive pattern exposed from an opening formed in the insulating cover layer.

In the wired circuit board of the present invention, it is preferable that the semi-conductive layer is formed to cover an upper surface and a lateral side surface of the conductive pattern.

In the wired circuit board of the present invention, it is preferable that the semi-conductive layer is a metal oxide layer.

The present invention covers a production method of a wired circuit board comprising the step of preparing a metal supporting board, the step of forming an insulating base layer with a pattern on an upper surface of the metal supporting board, the step of forming a conductive pattern on an upper surface of the insulating base layer, the step of forming a semi-conductive layer in succession on an upper surface and a lateral side surface of the conductive pattern, an upper surface and a lateral side surface of the insulating base layer exposed from the conductive pattern, and an upper surface of the metal supporting board exposed from the insulating base layer, the step of forming an insulating cover layer on a surface of the semi-conductive layer formed on the upper surface of the insulating base layer, including a continuous part between the semi-conductive layer formed on the upper surface of the insulating base layer and the semi-conductive layer formed on the lateral side surface of the insulating base layer, to cover the semi-conductive layer formed on the upper surface and lateral side surface of the conductive pattern and to form an opening from which the semi-conductive layer formed on the upper surface of the conductive pattern is exposed, and the step of removing the semi-conductive layer exposed from the opening, the semi-conductive layer formed on the upper surface of the insulating base layer and exposed from the insulating cover layer, and the semi-conductive layer formed on the upper surface of the metal supporting board to leave the semi-conductive layer formed on the lateral side surface of the insulating base layer at the continuous part and contacting with the upper surface of the metal supporting board.

The present invention also covers a production method of a wired circuit board comprising the step of preparing a metal supporting board, the step of forming an insulating base layer with a pattern on an upper surface of the metal supporting board, the step of forming a semi-conductive layer in succession on an upper surface and a lateral side surface of the insulating base layer and an upper surface of the metal supporting board exposed from the insulating base layer, the step of forming a conductive pattern on a surface of the semi-conductive layer formed on the upper surface of the insulating base layer, the step of forming an insulating cover layer on a surface of the semi-conductive layer formed on the upper surface of the insulating base layer, including a continuous part between the semi-conductive layer formed on the upper surface of the insulating base layer and the semi-conductive layer formed on the lateral side surface of the insulating base layer, to cover the upper surface and lateral side surface of the conductive pattern and to form an opening from which the upper surface of the conductive pattern is exposed, and the step of removing the semi-conductive layer formed on the upper surface of the insulating base layer and exposed from the insulating cover layer, and the semi-conductive layer formed on the upper surface of the metal supporting board to leave the semi-conductive layer formed on the lateral side surface of the insulating base layer at the continuous part and contacting with the upper surface of the metal supporting board.

The present invention also covers a production method of a wired circuit board comprising the step of preparing a metal supporting board, the step of forming an insulating base layer with a pattern on an upper surface of the metal supporting board, the step of forming a thin conductive film in succession on an upper surface and a lateral side surface of the insulating base layer and an upper surface of the metal supporting board exposed from the insulating base layer, the step of forming a conductive pattern on a surface of the thin conductive film formed on the upper surface of the insulating base layer, the step of forming a semi-conductive layer by subjecting the thin conductive film exposed from the conductive pattern to semi-conductive treatment, the step of forming an insulating cover layer on a surface of the semi-conductive layer formed on the upper surface of the insulating base layer, including a continuous part between the semi-conductive layer formed on the upper surface of the insulating base layer and the semi-conductive layer formed on the lateral side surface of the insulating base layer, to cover the upper surface and lateral side surface of the conductive pattern and to form an opening from which the upper surface of the conductive pattern is exposed, and the step of removing the semi-conductive layer formed on the upper surface of the insulating base layer and exposed from the insulating cover layer and the semi-conductive layer formed on the upper surface of the metal supporting board to leave the semi-conductive layer formed on the lateral side surface of the insulating base layer at the continuous part and contacting with the upper surface of the metal supporting board.

The wired circuit board of the present invention can produce the result that even when the metal supporting board, the insulating base layer, the insulating cover layer, and the terminal portion are charged by static electricity, the static electricity can be removed therefrom via the semi-conductive layer. Thus, the electronic component mounted can be effectively prevented from being damaged by the static electricity.

Besides, since the semi-conductive layer formed on the insulating base layer is covered with the insulating cover layer, the semi-conductive layer can be prevented from being stripped. Thus, the semi-conductive layer can be prevented from stripping and scattering as a foreign matter.

In addition, the production method of the wired circuit board of the present invention can produce the wired circuit board with ease and efficiency.

DESCRIPTION OF THE INVENTION

Figure 1:
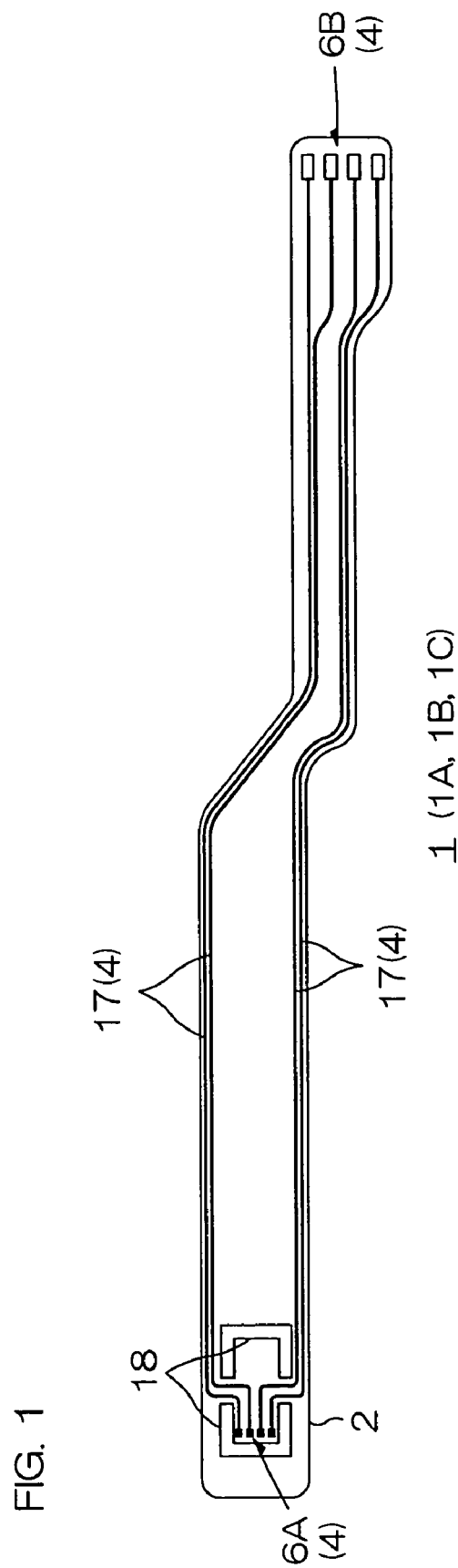
FIG. 1 is a schematic plan view showing a suspension board with circuit presented as an embodiment of a wired circuit board of the present invention.
Figure 2:
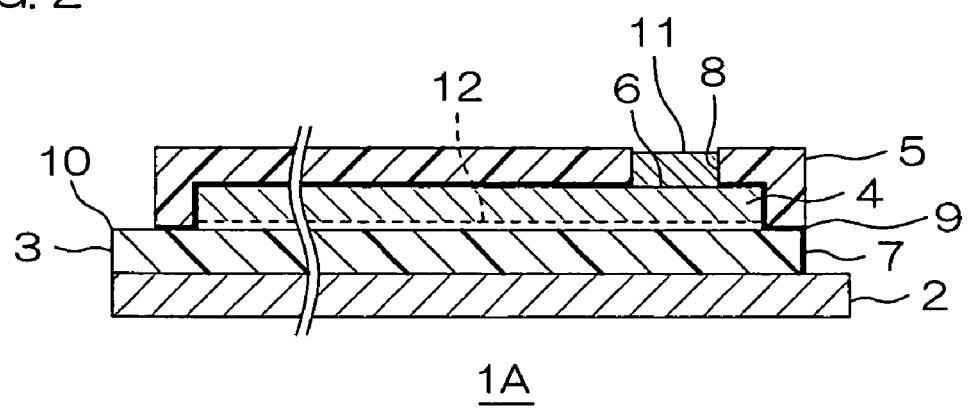
FIG. 2 is a partial sectional view of the suspension board with circuit shown in FIG. 1 taken along a longitudinal direction thereof (a partial sectional view of the suspension board with circuit 1A)

FIG. 1 is a schematic plan view showing a suspension board with circuit presented as an embodiment of a wired circuit board of the present invention, and FIG. 2 is a partial sectional view of the suspension board with circuit shown in FIG. 1 taken along a longitudinal direction thereof.

In the suspension board with circuit 1 of FIG. 1, a conductive pattern 4 for connecting a magnetic head and a read/write substrate is integrally formed on a metal supporting board 2 which is mounted on a hard disc drive and mounts the magnetic head thereon to hold it against an airflow generated when the magnetic head and a magnetic disk run relative to each other, while supporting the magnetic head closely spaced from the magnetic head.

To clarify a relative position of the conductive pattern 4 to the metal supporting board 2, an insulating base layer 3, an insulating cover layer 5, and a semi-conductive layer 7, which are mentioned later, are omitted from the metal supporting board 2 shown in FIG. 1.

The conductive pattern 4 comprises magnetic head connecting terminals 6A, external connecting terminals 6B, and wires 17 for connecting therebetween, all being integrally formed in succession in the conductive pattern 4.

The plurality of wires 17 extend along a longitudinal direction of the metal supporting board 2 and are arranged in parallel at spaced intervals with respect to the widthwise direction (the direction orthogonal to the longitudinal direction).

The magnetic head connecting terminals 6A are arranged at a front end portion of the metal supporting board 2, to connect with front end portions of the wires 17. Terminals (not shown) of the magnetic head are connected to the magnetic head terminals 6A.

The plurality of external connecting terminals 6B are arranged at a rear end portion of the metal supporting board 2, to connect with rear end portions of the wires 17. Terminals (not shown) of the read/write substrate are connected to the external connecting terminals 6B.

The metal supporting board 2 has gimbals 18, formed at a front end portion thereof, for mounting the magnetic head. The gimbals 18 are formed by cutting the metal supporting board 2 to sandwich the magnetic head connecting terminals 6A therebetween in the longitudinal direction.

The suspension board with circuit 1A comprises the metal supporting board 2, the insulating base layer 3 of a predetermined pattern formed on an upper surface of the metal supporting board 2, a conductive pattern 4 formed on an upper surface of the insulating base layer 3, and an insulating cover layer 5 of a predetermined pattern formed on the upper surface of the insulating base layer 3 to cover the upper surface and a lateral side surface of the conductive pattern 4, as shown in FIG. 2. The insulating cover layer 5 has openings 8 formed at locations corresponding to the magnetic head connecting terminal portions 6A or the external connecting terminals 6B to extend through the insulating cover layer 5 in a thickness direction thereof. Part of the conductive pattern 4 exposed from the openings 8 serves as the magnetic head connecting terminals 6A or the external connecting terminals 6B (which are hereinafter collectively called "the terminal portion 6"). In FIG. 2, only either the magnetic head connecting terminals 6A or the external connecting terminals 6B is shown.

In the suspension board with circuit 1A, the semi-conductive layer 7 is formed in succession on an upper surface of the insulating base layer 3 covered with the insulating cover layer 5 and on a lateral side surface and an upper surface of the conductive pattern 4, to be sandwiched between the insulating cover layer 5 and the insulating base layer 3 or the conductive pattern 4.

Also, the semi-conductive layer 7 is formed in succession on a lateral side surface of the insulating base layer 3 as well. To be more specific, the semi-conductive layer 7 extends from the upper surface of the insulating base layer 3 toward the upper surface of the metal supporting board 2 exposed from the insulating base layer 3, to cover the lateral side surface of the insulating base layer 3 and contacts with the upper surface of the metal supporting board 2.

The semi-conductive layer 7 formed on the lateral side surface of the insulating base layer 3 is exposed at a surface thereof (an outer surface thereof opposite to an inner surface thereof contacting with the insulating base layer 3). It also has an upper end surface on which the insulating cover layer 5 is laminated and a lower end surface with which the metal supporting board 2 contacts.

A metal plating layer 11 is formed on a surface of the terminal portion 6, as required.

Next, a production method of this suspension board with circuit 1A will be described with reference to FIG. 3.

In this method, the metal supporting board 2 is prepared, first, as shown in FIG. 3(a). A metal foil is used for the metal supporting board 2. For example, a stainless steel foil, a 42-alloy foil, an aluminum foil, a copper-beryllium foil, a phosphor bronze foil, etc. are used for the metal supporting board 2. Preferably, a stainless foil is used. The metal supporting board 2 has a thickness of e.g. 5-100 μm.

Then, the insulating base layer 3, for example, is formed on the upper surface of the metal supporting board 2 to be patterned so that a part of a periphery of the upper surface of the metal supporting board 2 is exposed, as shown in FIG. 3(b).

The materials that may be used for forming the insulating base layer 3 include, for example, resin films, such as polyimide resin, polyamide imide resin, acrylic resin, polyether nitrile resin, polyether sulfonic resin, polyethylene terephthalate resin, polyethylene naphthalate resin and polyvinyl chloride resin. Of these resins, polyimide resin is preferably used in terms of heat resistance. The insulating base layer 3 has a thickness of e.g. 5-50 μm, or preferable 10-30 μm.

A known method may be used for forming the insulating base layer 3 in the form of a predetermined pattern, though no particular limitation is imposed on the method. For example a varnish of a photosensitive resin (a photosensitive polyamic acid resin) is coated over a surface of the metal supporting board 2 and then dried, to form a base coat. Then, the base coat is exposed to light through a photo mask. The base coat may be heated to a predetermined temperature, if necessary. Thereafter, the coat is subjected to development, to be formed in a predetermined pattern. Then, the base coat thus patterned is heated to e.g. 250 or more under reduced pressure, to be cured (imidized).

Then, the conductive pattern 4 is formed on the upper surface of the insulating base layer 3, as shown in FIG. 3(c). The conductive pattern 4 is formed of copper, nickel, gold, solder, or alloys thereof, for example. Copper is preferably used for the conductive pattern 4. The conductive pattern 4 can be formed on the upper surface of the insulating base layer 3 by a known patterning process, such as a subtractive process and an additive process. Preferably, the conductive pattern 4 is formed in the form of a wired circuit pattern in which the terminal portion 6 and the wires 17 are integrally formed, using the additive process.

In the subtractive process, a conductor layer is laminated on the upper surface of the insulating base layer 3, first, via an adhesive layer, if required. Then, an etching resist having the same pattern as the wired circuit pattern is formed on the conductor layer. Then, with this etching resist as a resist, the conductor layer is etched and, thereafter, the etching resist is removed.

In the additive process, a thin conductive film 12 is formed on the entire surface (the upper surface and lateral side surface) of the insulating base layer 3, first. The thin conductive film 12 is formed in multilayer by laminating a thin chromium layer and a thin copper layer sequentially on the insulating base layer 3 by a sputtering process, preferably by a chromium sputtering process and a copper sputtering process.

Then, after a plating resist of a reverse pattern to the wired circuit pattern is formed on an upper surface of the thin conductive film 12, the conductive pattern 4 is formed in the form of the wired circuit pattern on the upper surface of the thin conductive film 12 exposed from the plating resist by electrolytic plating. Thereafter, the plating resist and the thin conductive film 12 on which the plating resist was laminated are removed.

The conductive pattern 4 thus formed has a thickness of e.g. 3-50 μm, or preferably 5-20 μm, and the wires 17 have each a width of e.g. 10-200 μm. An interval between adjacent wires 17 is for example in the range of 10-2001 μm.

Then, the semi-conductive layer 7 is formed in succession on the upper surface and lateral side surface of the conductive pattern 4, on the upper surface and lateral side surface of the insulating base layer 3 exposed from the conductive pattern 4, and on the upper surface of the metal supporting board 2 exposed from the insulating base layer 3, to extend over the respective surfaces, as shown in FIG. 3(d).

Preferably, the semi-conductive layer 7 is formed by a resin layer or a metal layer having a value of surface resistance of $10^5 \Omega/\square - 10^{11} \Omega/\square$ though no particular limitation is imposed thereon. For example, the semi-conductive layer 7 is formed by the resin layer in which conductive particles, such as, for example, carbon particles, metallic particles, and metal oxide particles, are dispersed. Preferably, the semi-conductive layer 7 is formed by the metal oxide layer.

The metal oxide layer is formed of metal oxide, such as, for example, chromium oxide, nickel oxide, copper oxide, titanium oxide, zirconium oxide, indium oxide, aluminum oxide, and zinc oxide. Preferably, the metal oxide layer is formed of chromium oxide. The chromium oxide can produce formation of the metal oxide layer having a steady surface-resistance value that does not vary substantially even under a high-temperature and high humidity environment.

While a degree of oxidation of the metal in the metal oxide layer depends on the formation of the metal oxide layer mentioned below, the metal of the metal oxide layer may be oxidized uniformly in the thickness direction or may alternatively be oxidized so that the degree of oxidization can be highest at the outermost surface and can be gradually reduced from the outermost surface toward the inside with respect to the thickness direction of the metal oxide layer.

No particular limitation is imposed on the process of forming the metal oxide layer. For example, the metal oxide layer can be formed by a process of sputtering a metal to form a coat, using the metal as a target, followed by oxidization of the coat by application of heat, as required, by a process of a reactive sputtering, or by a process of sputtering an metal oxide to form a coat using the metal oxide as the target.

In the process of sputtering a metal to form a coat, using the metal as a target, followed by oxidization of the coat by application of heat, as required, the sputtering using the metal as the target is carried out for the upper surface and lateral side surface of the conductive pattern 4, the upper surface and lateral side surface of the insulating base layer 3 exposed from the conductive pattern 4, and the upper surface of the metal supporting board 2 exposed from the insulating base layer 3.

Figure 8:
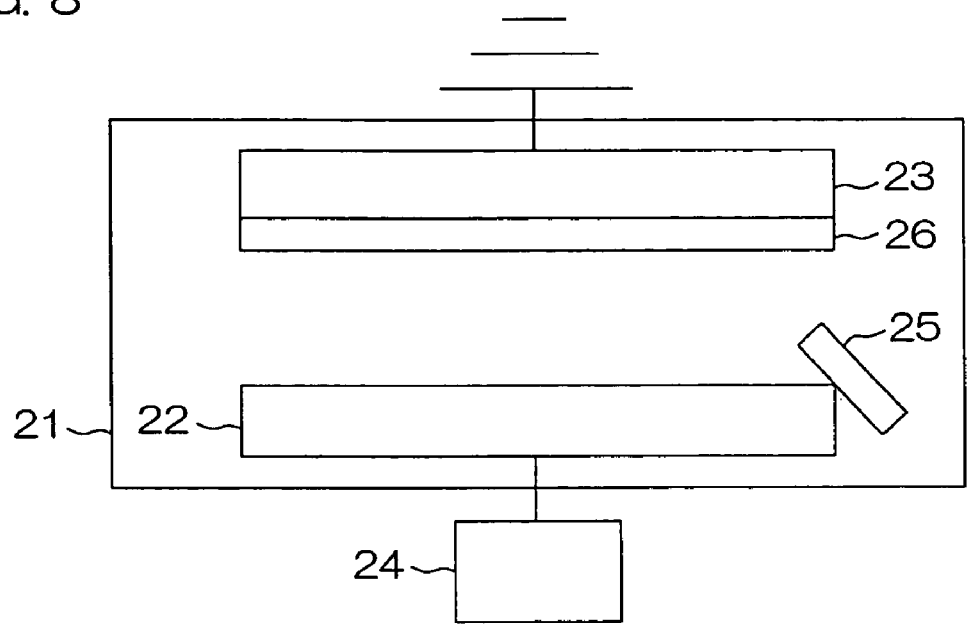
FIG. 8 is a block schematic diagram showing an embodiment of a sputtering apparatus.

For example, a sputtering apparatus shown in FIG. 8 is used for the sputtering. In the sputtering apparatus, a target 22 and an earth electrode 23 are arranged opposite to each other at a predetermined space in a vacuum chamber 21, as shown in FIG. 8. A power source 24 is connected to the target 22, and a plasma emission monitor 25 is arranged to emit plasma to the target 22. A pulsed power source, a direct current (DC) power source, an alternate current (RF) power source, etc. may be used as the power source 24.

The earth electrode 23 is electrically grounded, and a board 26 is placed on a surface of the earth electrode 23. (It is to be noted here that the board 26 is the suspension board with circuit 1A prepared in the courses of production shown in FIG. 3(c), which is placed with a portion thereof on the conductive pattern 4 side confronting the target 22.)

For example, chromium, nickel, copper, titanium, aluminum, tantalum, lead, zinc, zirconium, gallium, indium, and alloys thereof are used for the target 22. Preferably, chromium is used for the target 22.

Then, after an inert gas, such as argon gas, is introduced into the vacuum chamber 21, an electric power is applied to the target 22 from the power source 24, so that the target 22 is sputtered for a predetermined time while the plasma emission intensity is maintained at a constant value by the plasma emission monitor 25. In this sputtering, the sputtering coat is formed on the upper surface and lateral side surface of the conductive pattern 4, on the upper surface and lateral side surface of the insulating base layer 3 exposed from the conductive pattern 4, and on the upper surface of the metal supporting board 2 exposed from the insulating base layer 3.

An example of the sputtering conditions for the sputtering using those metals as the target is given below.

Ultimate vacuum: $1.33 \times 10^{-5}$ Pa to $1.33 \times 10^{-2}$ Pa

Flow rate of introduced gas (Argon): $1.2 \times 10^{-3}$ m$^3$/h to $4 \times 10^{-3}$ m$^3$/h Operating pressure (Degree of vacuum after introduction of introduced gas): $1.33 \times 10^{-2}$ Pa to 1.33 Pa Temperature of earth electrode: 10.-100.

Electric power: 100 W-2,000 W

Sputtering time: 1 sec. to 15 min.

In this sputtering, an adequate sputtering is selected from known sputtering methods, such as a direct current (DC) sputtering, a radio frequency (RF) sputtering, a magnetron sputtering, or combination thereof.

When the sputtering coat is oxidized by the application of heat as required, the way of heating is not limited to any particular one. For example, the sputtering coat is heated in the atmosphere using a heating furnace. The heating temperature is preferably in the range of e.g. 50.-400., or preferably 100.-250., and the heating time is preferably in the range of e.g. one minute to twelve hours. As a result of this sputtering process, the semi-conductive layer 7 of the metal oxide layer is formed on the upper surface and lateral side surface of the conductive pattern 4, on the upper surface and lateral side surface of the insulting base layer 3 exposed from the conductive pattern 4, and on the upper surface of the metal supporting board 2 exposed from the insulating base layer 3, as shown in FIG. 3(d).

When the sputtering coat oxidizes naturally in the air exposure, it need not necessarily heated or may be heated for the purpose of forming a stable metal oxide layer.

This metal oxide layer is oxidized in such a manner that the degree of oxidization can be highest at the outermost surface and can be gradually reduced from the outermost surface toward the inside with respect to the thickness direction of the metal oxide layer.

In the reactive sputtering, the same processes as those of the sputtering mentioned above are taken, except that the introduced gas comprising oxygen is introduced into the vacuum chamber 21 of the sputtering apparatus shown in FIG. 8.

To be more specific, the same metal used as the target 22 for forming the sputtering coat as the one mentioned above is used, and the suspension board with circuit 1A in the process of production shown in FIG. 3(c) is placed so that a portion of the suspension board with circuit 1A on the conductive pattern 4 side confronts the target 22, as the board 26.

Then, after a reactive gas wherein argon or nitrogen, and oxygen of an essential gas are mixed in a given proportion (e.g. Ar/O$_2$ mixed gas, N$_2$/O$_2$ mixed gas) is introduced in the vacuum chamber 21, an electric power is applied to the target 22 from the power source 24, so that the target 22 is sputtered for a predetermined time while the plasma emission intensity is maintained at a constant value by the plasma emission monitor 25.

As a result of this reactive sputtering, the semi-conductive layer 7 of the metal oxide layer is formed on the upper surface and lateral side surface of the conductive pattern 4, on the upper surface and lateral side surface of the insulating base layer 3 exposed from the conductive pattern 4, and on the upper surface of the metal supporting board 2 exposed from the insulating base layer 3, as shown in FIG. 3(d). The metal oxide layer thus formed is oxidized uniformly in the thickness direction.

An example of the sputtering conditions for the reactive sputtering is given below.

Ultimate vacuum: $1.33 \times 10^{-5}$ Pa to $1.33 \times 10^{-2}$ Pa

Flow rate of introduced gas:

(For Ar/O$_2$ mixed gas)

Ar: $1.2 \times 10^{-3}$ m$^3$/h to $2.4 \times 10^{-3}$ m$^3$/h

O$_2$: $6 \times 10^{-5}$ m$^3$/h to $30 \times 10^{-5}$ m$^3$/h (For N$_2$/O$_2$ mixed gas)

N$_2$: $1.2 \times 10^{-3}$ m$^3$/h to $2.4 \times 10^{-3}$ m$^3$/h

O$_2$: $6 \times 10^{-5}$ m$^3$/h to $30 \times 10^{-5}$ m3/h

Operating pressure (Degree of vacuum after introduction of introduced gas): $1.33 \times 10^{-2}$ Pa to 1.33 Pa Temperature of earth electrode: 10.-100.

Electric power: 100 W-2,000 W

Sputtering time: 3 sec. to 15 min.

In the sputtering using the metal oxide as the target, the same processes as those of the sputtering mentioned above are taken, except that the metal oxide is used as the target 22 and the AC power is used as the power source in the sputtering apparatus shown in FIG. 8. The metal oxides that may be used for the target 22 include, for example, chromium oxide, zirconium oxide, silicon oxide, tin oxide, titanium oxide, magnesium oxide, and aluminum oxide. Preferably, the chromium oxide is used for the target 22.

To be more specific, the metal oxide cited above is used for the target 22, and the suspension board with circuit 1A in the process of production shown in FIG. 3(c) is placed so that a portion of the suspension board with circuit 1A on the conductive pattern 4 side confronts the target 22, as the board 26.

Then, after an inert gas such as argon and the like is introduced in the vacuum chamber 21, an electric power is applied to the target 22 from the power source 24, so that the target 22 is sputtered for a predetermined time while the plasma emission intensity is maintained at a constant value by the plasma emission monitor 25. As a result of this sputtering, the semi-conductive layer 7 of the metal oxide layer is formed on the upper surface and lateral side surface of the conductive pattern 4, on the upper surface and lateral side surface of the insulating base layer 3 exposed from the conductive pattern 4, and on the upper surface of the metal supporting board 2 exposed from the insulating base layer 3, as shown in FIG. 3(d). The metal oxide layer thus formed is oxidized uniformly in the thickness direction.

An example of the sputtering conditions for the sputtering using this metal oxide as the target is given below.

Ultimate vacuum: $1.33 \times 10^{-5}$ Pa to $1.33 \times 10^{-2}$ Pa

Flow rate of introduced gas (Argon): $1.2 \times 10^{-3}$ m$^3$/h to $4 \times 10^{-3}$ m$^3$/h Operating pressure (Degree of vacuum after introduction of introduced gas): $1.33 \times 10^{-2}$ Pa to 1.33 Pa Temperature of earth electrode: 10.-100.

Electric power: RF 100 W-2,000 W

Sputtering time: 1 sec. to 15 min.

The semi-conductive layer 7 thud formed is set to have a thickness in the range of e.g. 0.005-0.05 μm, or preferably 0.01-0.02 μm. When the thickness of the semi-conductive layer 7 falls within this range, an effective value of surface resistance can be obtained.

Also, it is preferable that a value of surface resistance of the semi-conductive layer 7 is set to be in the range of $10^5$./.-$10^{11}$./.. When the value of surface resistance of the semi-conductor layer 7 is less than $10^5$./., there is a possibility that an operation error of an electronic component mounted may be caused. On the other hand, when the value of surface resistance of the semi-conductor layer 7 is more than $10^{11}$./., there is a possibility that the damage caused by the static electricity cannot be prevented.

Then, the insulating cover layer 5 for covering the semi-conductive layer 7 formed on the upper surface and lateral side surface of the conductive pattern 4 is formed on a surface of the semi-conductive layer 7 formed on the upper surface of the insulating base layer 3, to be in the form of the following pattern, as shown in FIG. 3(e).

Specifically, the insulating cover layer 5 is formed on the surface of the semi-conductive layer 7 formed on the upper surface of the conductive pattern 4 in such a manner that the opening 8 from which the semi-conductive layer 7 is exposed is formed at a location corresponding to the terminal portions 6.

Also, the insulating cover layer 5 is formed so that it can be laminated on a continuous part 9 of the semi-conductive layer 7 formed on the upper surface of the insulating base layer 3 to the semi-conductive layer 7 formed on the lateral side surface of the insulating base layer 3, as well (in other words, on an upper end surface of the semi-conductive layer 7 formed on the lateral side surface of the insulating base layer 3). The insulating cover layer 5 need not be formed on an end face of the upper surface of the insulating base layer 3 at a discontinuous part 10 of the semi-conductive layer 7 formed on the upper surface of the insulating base layer 3 to the semi-conductive layer 7 formed on the lateral side surface of the insulating base layer 3. The insulating cover layer 5 formed is just required to cover the lateral side surface of the conductive pattern 4.

This insulating cover layer 5 is formed of the same resin film as that of the insulting base layer 3. Preferably, a polyimide resin is used for the insulating cover layer 5 in terms of heat resistance. The insulating cover layer 5 has a thickness of e.g. 5-50 µm, or preferably 10-30 µm.

A known method may be used for forming the insulating cover layer 5 in the form of a predetermined pattern, though no particular limitation is imposed on the method. For example a varnish of a photosensitive resin (a photosensitive polyamic acid resin) is coated over the entire surface of the semi-conductive layer 7 and then dried, to form a cover coat. Then, the cover coat thus formed is exposed to light through a photo mask and is heated, if necessary. Then, the coat is subjected to development, to form a pattern. Thereafter, the cover coat thus patterned is heated to e.g. 250. or more under a reduced pressure, to be cured (imidized).

Then, the semi-conductive layer 7 exposed from the opening 8 of the insulating cover layer 5, the semi-conductive layer 7 formed on the upper surface of the insulating base layer 3 exposed from the insulating cover layer 5, and the semi-conductive layer 7 formed on the upper surface of the metal supporting board 2 are removed by etching, as shown in FIG. 3(f).

In the etching process, after an etching resist is placed so that the semi-conductive layer 7 to be etched can be exposed and the remaining parts can be covered, the semi-conductive layer 7 to be etched is removed by using etching solution. Thereafter, the etching resist is removed by stripping.

The etching solution is properly selected for the semi-conductive layer 7 used. The etching solutions that may be used, for example, for the semi-conductive layer 7 of the chromium oxide layer include, for example, a potassium ferricyanide etching solution, a potassium permanganate etching solution, a sodium metasilicate etching solution, a cerium ammonium nitrate etching solution, a hydrochloric acid etching solution, a sulfuric acid etching solution, and a nitric acid etching solution.

In this etching process, the semi-conductive layer is etched so that the semi-conductor layer 7 formed on the lateral side surface of the insulating base layer 3 can remain. The semi-conductive layer 7 formed on the lateral side surface of the insulating base layer 3 is continuous with the semi-conductive layer 7 formed on the upper surface of the insulating base layer 3 through the continuous part 9 at an upper end thereof and is in contact with a peripheral edge of the insulating base layer 3 on the upper surface of the metal supporting board 2 at a lower end thereof.

As a result of this etching, the semi-conductive layer 7 exposed from the opening 8 is removed and part of the conductive pattern 4 is exposed from the opening 8. This exposed part of the conductive pattern 4 serves as the terminal portion 6.

Thereafter, the metal plating layer 11 is formed on a surface of the terminal portion 6, if required, as shown in FIG. 3(g). Then, the metal supporting board 2 is cut out by chemical etching to form a gimbal 18 and then trimmed. The suspension board with circuit 1A is produced by the processes mentioned above.

The metal plating layer 11 is formed of a metal, such as gold, nickel, and the like, and is formed by plating, such as an electrolytic plating and electroless plating. Preferably, nickel and gold are plated sequentially to form the metal plating layer 11 as a multilayer of nickel/gold. The metal plating layer 11 has a thickness of e.g. 0.5-2 µm.

In the suspension board with circuit 1A thus obtained, the semi-conductive layer 7 is formed in succession on the lateral side and upper surface of the conductive pattern 4 and on the upper surface and lateral side surface of the insulating base layer 3, and the semi-conductive layer 7 formed on the lateral side surface of the insulting base layer 3 is in contact with the upper surface of the metal supporting board 2 at a lower end surface thereof.

This construction can produce the result that even when the metal supporting board 2, the insulating base layer 3, the insulating cover layer 5, and the terminal portion 6 are charged by static electricity, the static electricity can be removed therefrom via the semi-conductive layer 7. Thus, the electronic component mounted can be effectively prevented from being damaged by the static electricity.

Also, since the semi-conductive layer 7 formed on the lateral side surface and upper surface of the conductive pattern 4 and on the upper surface of the insulating base layer 3 (including the continuous part 9) are covered with the insulating cover layer 5, the semi-conductive layer 7 can be prevented from being stripped. Thus, the semi-conductive layer 7 can be prevented from stripping and scattering as a foreign matter.

Figure 3:
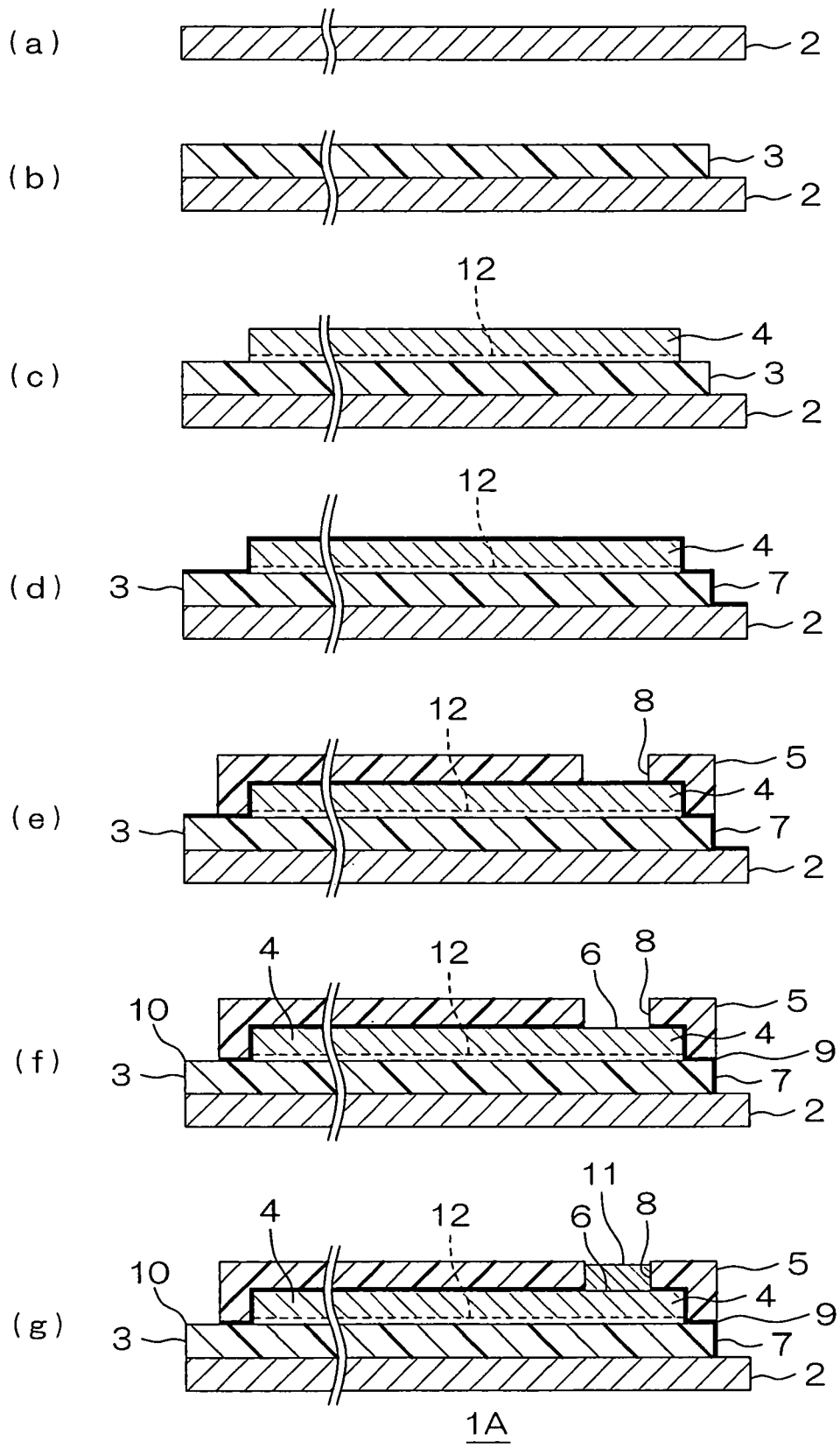
FIG. 3 is a process drawing of a production method of the suspension board with circuit shown in FIG. 2, (a) showing the process of preparing a metal supporting board, (b) showing the process of forming an insulating base layer with a predetermined pattern on the upper surface of the metal supporting board, (c) showing the process of forming a conductive pattern on an upper surface of the insulating base layer, (d) showing the process of forming a semi-conductive layer on an upper surface and a lateral side surface of the conductive pattern, on an upper surface and a lateral side surface of the insulating base layer exposed from the conductive pattern, and on an upper surface of the metal supporting board exposed from the insulating base layer, (e) showing the process of forming an insulating cover layer with a predetermined pattern on a surface of the semi-conductive layer formed on the upper surface of the insulating base layer, to cover the semi-conductive layer formed on the upper surface and lateral side surface of the conductive pattern, (f) showing the process of removing by etching the semi-conductive layer exposed from an opening of the insulating cover layer, the semi-conductive layer formed on the upper surface of the insulating base layer exposed from the insulting cover layer, and the semi-conductive layer formed on the upper surface of the metal supporting board, and (g) showing the process of forming a metal plating layer on a surface of the terminal portion.

In addition, the production method of the suspension board with circuit 1A shown in FIG. 3 can produce the suspension board with circuit 1A just described in a simple manner and with efficiency.

Figure 4:
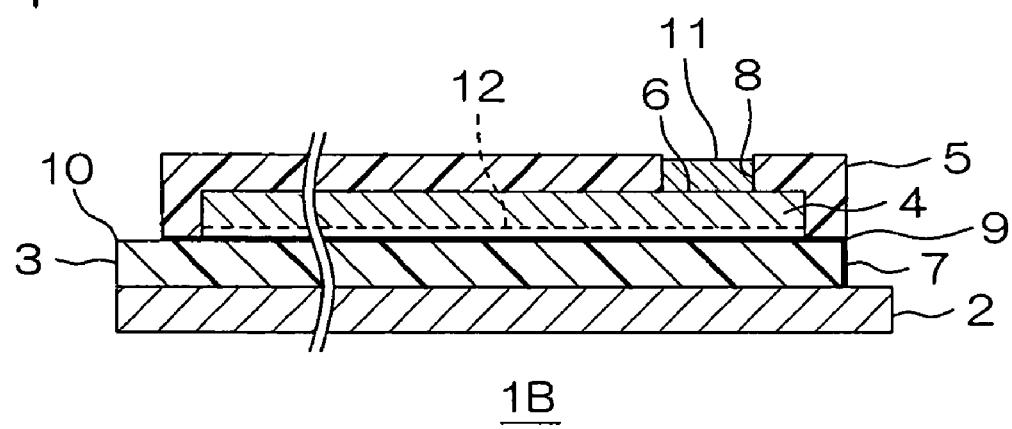
FIG. 4 is a partial sectional view of the suspension board with circuit shown in FIG. 1 taken along a longitudinal direction thereof (a partial sectional view of the suspension board with circuit 1B)

As an alternative to the suspension board with circuit 1A just described having the semi-conductive layer 7 formed in succession on the lateral side surface and upper surface of the conductive pattern 4, on the upper surface of the insulating base layer 3, and on the lateral side surface of the insulating base layer 3 adjacent to the metal supporting board 2, the suspension board with circuit may be constructed so that the semi-conductive layer 7 can be formed in succession on between the upper surface of the insulating base layer 3 and the conductive pattern 4 and on between the upper surface of the insulating base layer 3 and the insulating cover layer 5, and on the lateral side surface of the insulating base layer 3 adjacent to the metal supporting board 2, as in a suspension board with circuit 1B shown in FIG. 4. In FIG. 4, like reference numerals and characters are labeled to corresponding members and parts to those of the embodiment just described and the description on those members and parts is omitted.

Specifically, in the suspension board with circuit 1B of FIG. 4, the semi-conductive layer 7 is formed in succession on the upper surface of the insulating base layer 3 at a part thereof covered with the insulating cover layer 5 and on the upper surface of the insulating base layer 3 on which the conductive pattern 4 is formed, so that the semi-conductive layer 7 is sandwiched between the insulating base layer 3 and the conductive pattern 4 and between the insulating base layer 3 and the insulating cover layer 5.

Also, the semi-conductive layer 7 is formed in succession on the lateral side surface of the insulating base layer 3 as well. To be more specific, the semi-conductive layer 7 extends continuously from the upper surface of the insulating base layer 3 toward the upper surface of the metal supporting board 2 exposed from the insulating base layer 3 to cover the lateral side surface of the insulating base layer 3 and contacts with the upper surface of the metal supporting board 2.

A surface of the semi-conductive layer 7 formed on the lateral side surface of the insulating base layer 3 (an outer surface thereof opposite to an inner surface contacting with the insulating base layer 3) is exposed and contacts with the upper surface of the metal supporting board 2 at a lower end thereof.

Next, a production method of this suspension board with circuit 1B will be described with reference to FIG. 5.

In this method, the metal supporting board 2 is prepared, first, in the same manner as above, as shown in FIG. 5(a). Then, the insulating base layer 3 is formed on the upper surface of the metal supporting board 2 to be patterned so that a part of a periphery of the upper surface of the metal supporting board 2 is exposed, as shown in FIG. 5(b).

Then, the semi-conductive layer 7 is formed in succession on the upper surface and lateral side surface of the insulating base layer 3 and on the upper surface of the metal supporting board 2 exposed from the insulating base layer 3, to extend over those surfaces, as shown in FIG. 5(c). The semi-conductive layer 7 is formed in the same manner as in the above.

Thereafter, the conductive pattern 4 is formed on a surface of the semi-conductive layer 7 formed on the insulating base layer 3, as shown in FIG. 5(d). The conductive pattern 4 is formed by a known patterning process, such as the subtractive process and the additive process. Preferably, the conductive pattern 4 is formed in the form of a wired circuit pattern in which the terminal portion 6 and the wires 17 are integrally formed, using the additive process.

When the conductive pattern 4 is formed on the semi-conductive layer 7 formed of the chromium oxide layer by the additive process, only the thin copper film is formed, without forming the thin chromium film, when the thin conductive film 12 is formed on that semi-conductive layer 7.

Then, the insulating cover layer 5 for covering the upper surface and lateral side surface of the conductive pattern 4 is formed on a surface of the semi-conductive layer 7 formed on the upper surface of the insulating base layer 3, to be in the form of the following pattern, as shown in FIG. 5(e).

Specifically, the insulating cover layer 5 is formed on the upper surface of the conductive pattern 4 in such a manner that the opening 8 from which the upper surface of the conductive pattern 4 is exposed is formed at a location corresponding to the terminal portions 6.

Also, the insulating cover layer 5 is formed so that it can be laminated on the continuous part 9 of the semi-conductive layer 7 formed on the upper surface of the insulating base layer 3 to the semi-conductive layer 7 formed on the lateral side surface of the insulating base layer 3, as well. The insulating cover layer 5 need not be formed on an end face of the upper surface of the insulating base layer 3 at the discontinuous part 10 of the semi-conductive layer 7 formed on the upper surface of the insulating base layer 3 to the semi-conductive layer 7 formed on the lateral side surface of the insulating base layer 3. The insulating cover layer 5 formed is just required to cover the lateral side surface of the conductive pattern 4.

This insulating cover layer 5 is formed in the same manner as in the above.

Part of the conductive pattern 4 exposed from the opening 8 of the insulating cover layer 5 is formed as the terminal portion 6.

Then, the semi-conductive layer 7 formed on the upper surface of the insulating base layer 3 exposed from the insulating cover layer 5, and the semi-conductive layer 7 formed on the upper surface of the metal supporting board 2 are removed by etching in the same manner as in the above, as shown in FIG. 5(f).

In the etching process, the semi-conductive layer 7 is etched in the same manner as in the above so that the semi-conductor layer 7 formed on the lateral side surface of the insulating base layer 3 can remain. The semi-conductive layer 7 formed on the lateral side surface of the insulating base layer 3 is continuous with the semi-conductive layer 7 formed on the upper surface of the insulating base layer 3 through the continuous part 9 at an upper end thereof and is in contact with a peripheral edge of the insulating base layer 3 on the upper surface of the metal supporting board 2 at a lower end thereof.

Thereafter, the metal plating layer 11 is formed on a surface of the terminal portion 6, if required, as shown in FIG. 5(g). Then, the metal supporting board 2 is cut out by chemical etching to form the gimbal 18 and then trimmed. The suspension board with circuit 1B is produced by the processes mentioned above.

In the suspension board with circuit 1B thus obtained, the semi-conductive layer 7 is formed in succession on the upper surface of the insulating base layer 3 covered with the insulting cover layer 5 and on the upper surface of the insulating base layer 3 on which the conductive pattern 4 is formed, and the semi-conductive layer 7 formed on the lateral side surface of the insulting base layer 3 is in contact with the upper surface of the metal supporting board 2 at a lower end surface thereof.

This construction can produce the result that even when the metal supporting board 2, the insulating base layer 3, the insulating cover layer 5, and the terminal portion 6 are charged by static electricity, the static electricity can be removed therefrom via the semi-conductive layer 7. Thus, the electronic component mounted can be effectively prevented from being damaged by the static electricity.

Also, since the semi-conductive layer 7 formed on the upper surface of the insulating base layer 3 (including the continuous part 9) is covered with the conductive pattern 4 and the insulating cover layer 5, the semi-conductive layer 7 can be prevented from being stripped. Thus, the semi-conductive layer 7 can be prevented from stripping and scattering as a foreign matter.

Figure 5:
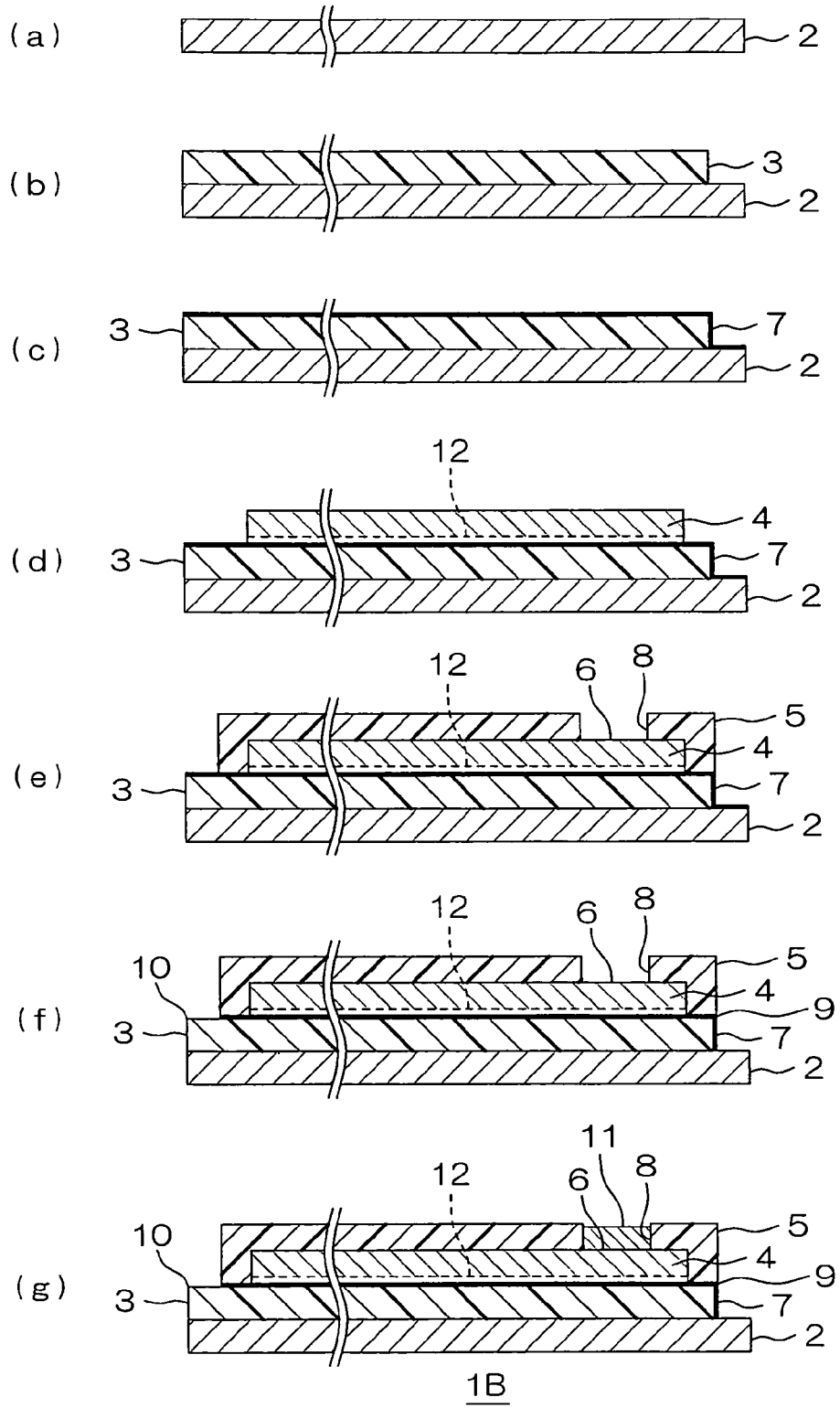
FIG. 5 is a process drawing of a production method of the suspension board with circuit shown in FIG. 4, (a) showing the process of preparing a metal supporting board, (b) showing the process of forming an insulating base layer with a predetermined pattern on an upper surface of the metal supporting board, (c) showing the process of forming a semi-conductive layer on an upper surface and a lateral side surface of the insulating base layer and on an upper surface of the metal supporting board exposed from the insulating base layer, (d) showing the process of forming a conductive pattern on a surface of the semi-conductive layer formed on the upper surface of the insulating base layer, (e) showing the process of forming an insulating cover layer with a predetermined pattern on a surface of the semi-conductive layer formed on the upper surface of the insulating base layer, to cover the upper surface and lateral side surface of the conductive pattern, (f) showing the process of removing by etching the semi-conductive layer formed on the upper surface of the insulating base layer exposed from the insulating cover layer and the semi-conductive layer formed on the upper surface of the metal supporting board, and (g) showing the process of forming a metal plating layer on a surface of the terminal portion.

In addition, the production method of the suspension board with circuit 1B shown in FIG. 5 can produce the suspension board with circuit 1B just described in a simple manner and with efficiency.

Figure 6:
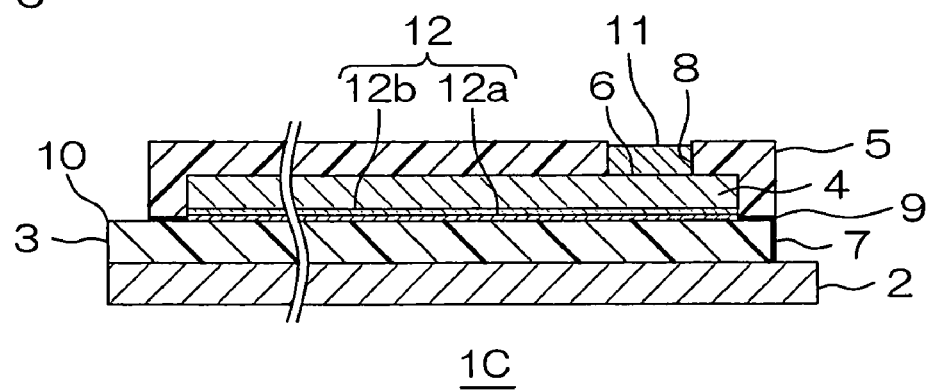
FIG. 6 is a partial sectional view of the suspension board with circuit shown in FIG. 1 taken along a longitudinal direction thereof (a partial sectional view of the suspension board with circuit 1C)

In addition, the suspension board with circuit may be constructed so that the semi-conductive layer 7 can be formed in succession on between the upper surface of the insulating base layer 3 and the insulating cover layer 5 and on the lateral side surface of the insulating base layer 3 adjacent to the metal supporting board 2, as in a suspension board with circuit 1C shown in FIG. 6. In FIG. 6, like reference numerals and characters are labeled to corresponding members and parts to those of the embodiments described above and the description on those members and parts is omitted.

Specifically, in the suspension board with circuit 1C shown in FIG. 6, the semi-conductive layer 7 is formed in succession on the upper surface of the insulating base layer 3 at a part thereof covered with the insulating cover layer 5 (the upper surface of the insulating base layer 3 exposed from the conductive pattern 4) in such a manner as to contact with the lateral side surface of the conductive pattern 4 and be sandwiched between the insulating base layer 3 and the insulating cover layer 5.

Also, the semi-conductive layer 7 is formed in succession on the lateral side surface of the insulating base layer 3 as well. To be more specific, the semi-conductive layer 7 extends continuously from the upper surface of the insulating base layer 3 toward the upper surface of the metal supporting board 2 exposed from the insulating base layer 3 to cover the lateral side surface of the insulating base layer 3 and contacts with the upper surface of the metal supporting board 2.

A surface of the semi-conductive layer 7 formed on the lateral side surface of the insulating base layer 3 (an outer surface thereof opposite to an inner surface contacting with the insulating base layer 3) is exposed and contacts with the upper surface of the metal supporting board 2 at a lower end thereof. The insulating cover layer 5 is laminated on the upper surface of the semi-conductive layer 7 at the upper end thereof.

Next, a production method of this suspension board with circuit 1C will be described with reference to FIG. 7.

In this method, the metal supporting board 2 is prepared, first, in the same manner as above, as shown in FIG. 7(a). Then, the insulating base layer 3 is formed on the upper surface of the metal supporting board 2 to be patterned so that, for example, a part of a periphery of the upper surface of the metal supporting board 2 is exposed, as shown in FIG. 7(b).

Then, the conductive pattern 4 is formed by an additive process on the upper surface of the insulating base layer 3, as shown in FIG. 7(c) to 7(f).

When the conductive pattern 4 is formed by the additive process, a thin conductive film 12 comprising a thin chromium film 12a and a thin copper film 12b which are laminated sequentially is formed in succession on the upper surface and lateral side surface of the insulting base layer 3 and on the upper surface of the metal supporting board 2 exposed from he insulating base layer 3, first, as shown in FIG. 7(c).

In the formation of the thin conductive film 12, the thin chromium film 12a and the thin copper film 12b are laminated sequentially on the upper surface and lateral side surface of the insulating base layer 3 and the upper surface of the metal supporting board 2 by being subjected to a successive sputtering of a chromium sputtering and a copper sputtering.

The thin chromium film 12a has a thickness of e.g. 100-700 Å, or preferably 150-400 Å, and the thin copper film 12b has a thickness of e.g. 300-2,000 Å, or preferably 400-1,000 Å.

Then, a plating resist 13 of a reverse pattern to the wired circuit pattern mentioned above is formed, as shown in FIG. 7(d). The plating resist 13 is produced in the form of a reverse pattern to the wired circuit pattern, for example, by the process that after a dry film resist is laminated on a surface of the thin conductive film 12, the dry film resist is exposed to light and then developed, though no particular limitation is imposed thereon.

Then, the conductive pattern 4 is formed on the surface of the thin conductive film 12 exposed from the plating resist 13 in the form of the wired circuit pattern in which the terminal portion 6 and the wires 17 are integrally formed, by electrolytic plating, or preferably electrolytic copper plating, as shown in FIG. 7(e).

Thereafter, the plating resist 13 is removed by etching or by stripping, for example, as shown in FIG. 7(f).

Then, the thin copper film 12b exposed from the conductive pattern 4 (the entire surface thereof other than the surface on which the conductive pattern 4 is formed) is removed by etching so that the thin chromium film 12a can remain, as shown in FIG. 7(g). The thin copper film 12b is etched by wet etching using e.g. nitric acid solution and hydrogen peroxide solution as the etching solution.

Thereafter, the thin chromium film 12a exposed by the removal of the thin copper film 12b is subjected to semi-conductive treatment, to form the semi-conductive layer 7 of the chromium oxide layer, as shown in FIG. 7(h).

The thin chromium film 12a can be made semi-conductive by the process of oxidizing the thin chromium film 12a by the application of heat, through no particular limitation is imposed on the semi-conductive treatment. To be more specific, the thin chromium film 12a is heated in the atmosphere using a heating furnace in the same manner as above. The heating temperature is preferably in the range of e.g. 50.-400., or preferably 100.-250., and the heating time is preferably in the range of e.g. one minute to twelve hours.

As a result of this process, the semi-conductive layer 7 is formed in succession on the upper surface of the insulting base layer 3 exposed from the conductive pattern 4 (the entire surface thereof other than the surface on which the conductive pattern 4 is formed), on the lateral side surface of the insulating base layer 3, and on the upper surface of the metal supporting board 2 exposed from the insulating base layer 3, to continuously extend over those surfaces, as shown in FIG. 7(h).

Then, the insulating cover layer 5 for covering the upper surface and lateral side surface of the conductive pattern 4 is formed on a surface of the semi-conductive layer 7 formed on the upper surface of the insulating base layer 3, to be in the form of the following pattern, as shown in FIG. 7(i).

Specifically, the insulating cover layer 5 is formed on the upper surface of the conductive pattern 4 in such a manner that the opening 8 from which the upper surface of the conductive pattern 4 is exposed is formed at a location corresponding to the terminal portions 6.

Also, the insulating cover layer 5 is formed so that it can be laminated on the continuous part 9 of the semi-conductive layer 7 formed on the upper surface of the insulating base layer 3 to the semi-conductive layer 7 formed on the lateral side surface of the insulating base layer 3, as well. The insulating cover layer 5 need not be formed on an end face of the upper surface of the insulating base layer 3 at the discontinuous part 10 of the semi-conductive layer 7 formed on the upper surface of the insulating base layer 3 to the semi-conductive layer 7 formed on the lateral side surface of the insulating base layer 3. The insulating cover layer 5 formed is just required to cover the lateral side surface of the conductive pattern 4.

This insulating cover layer 5 is formed in the same manner as in the above.

Part of the conductive pattern 4 exposed from the opening 8 of the insulating cover layer 5 is formed as the terminal portion 6.

Then, the semi-conductive layer 7 formed on the upper surface of the insulating base layer 3 exposed from the insulating cover layer 5, and the semi-conductive layer 7 formed on the upper surface of the metal supporting board 2 are removed by etching in the same manner as in the above, as shown in FIG. 7(j).

In the etching process, the semi-conductive layer 7 is etched in the same manner as in the above so that the semi-conductor layer 7 formed on the lateral side surface of the insulating base layer 3 can remain. The semi-conductive layer 7 formed on the lateral side surface of the insulating base layer 3 is continuous with the semi-conductive layer 7 formed on the upper surface of the insulating base layer 3 through the continuous part 9 at an upper end thereof and is in contact with a peripheral edge of the insulating base layer 3 on the upper surface of the metal supporting board 2 at a lower end thereof.

Thereafter, the metal plating layer 11 is formed on a surface of the terminal portion 6, if required, in the same manner as above, as shown in FIG. 7(k). Then, the metal supporting board 2 is cut out by chemical etching to form the gimbal 18 and then trimmed. The suspension board with circuit 1C is produced by the processes mentioned above.

In the suspension board with circuit 1C thus obtained, the semi-conductive layer 7 is formed on the upper surface of the insulating base layer 3 exposed from the conductive pattern 4, to contact with the lateral side surface of the conductive pattern 4, and the semi-conductive layer 7 formed on the lateral side surface of the insulting base layer 3 is in contact with the upper surface of the metal supporting board 2 at a lower end surface thereof.

This construction can produce the result that even when the metal supporting board 2, the insulating base layer 3, the insulating cover layer 5, and the terminal portion 6 are charged by static electricity, the static electricity can be removed therefrom via the semi-conductive layer 7. Thus, the electronic component mounted can be effectively prevented from being damaged by the static electricity.

Also, since the semi-conductive layer 7 formed on the upper surface of the insulating base layer 3 (including the continuous part 9) is covered with the insulating cover layer 5, the semi-conductive layer 7 can be prevented from being stripped. Thus, the semi-conductive layer 7 can be prevented from stripping and scattering as a foreign matter.

Figure 7:
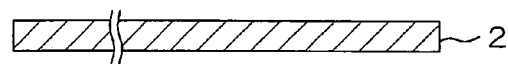
FIG. 7 is a process drawing of a production method of the suspension board with circuit shown in FIG. 6, (a) showing the process of preparing a metal supporting board, (b) showing the process of forming an insulating base layer with a predetermined pattern on an upper surface of the metal supporting board, (c) showing the process of forming a thin conductive film comprising a thin chromium film and a thin copper film which are laminated sequentially on an upper surface and a lateral side surface of the insulating base layer and on an upper surface of the metal supporting board exposed from the insulating base layer, (d) showing the process of forming a plating resist of a reverse pattern to the conductive pattern, (e) showing the process of forming a conductive pattern on a surface of the thin conductive film exposed from the plating resist, (f) showing the process of removing the plating resist, (g) showing the process of removing by etching the thin copper film from the conductive pattern, (h) showing the process of forming a semi-conductive layer of a chromium oxide film by subjecting a thin chromium film to semi-conductive treatment, (i) showing the process of forming an insulating cover layer with a predetermined pattern on a surface of the semi-conductive layer formed on the upper surface of the insulating base layer, to cover the upper surface and lateral side surface of the conductive pattern, (j) showing the process of removing by etching the semi-conductive layer formed on the upper surface of the insulating base layer exposed from the insulating cover layer and the semi-conductive layer formed on the upper surface of the metal supporting board, and (k) showing the process of forming a metal plating layer on a surface of the terminal portion.
Figure 7:
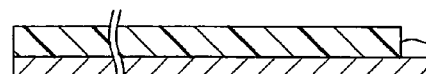
Figure 7:
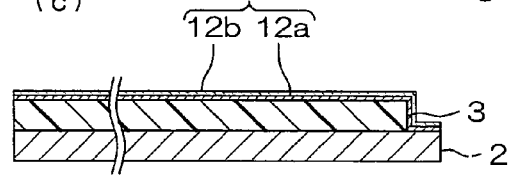
Figure 7:
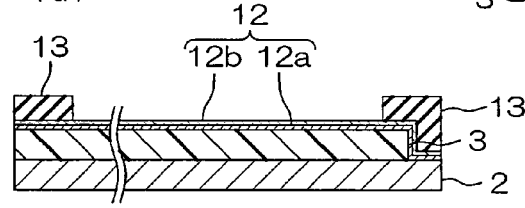
Figure 7:
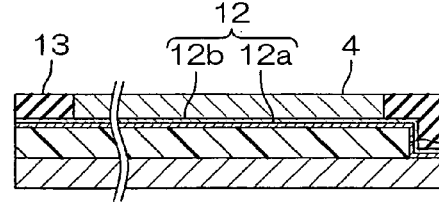
Figure 7:
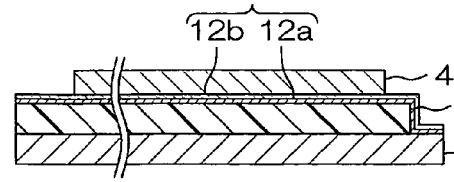
Figure 7:
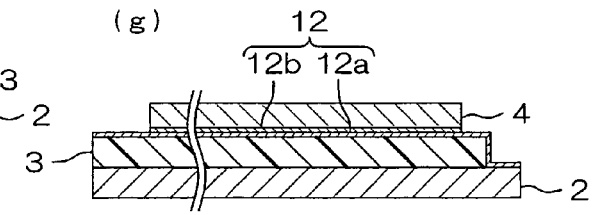
Figure 7:
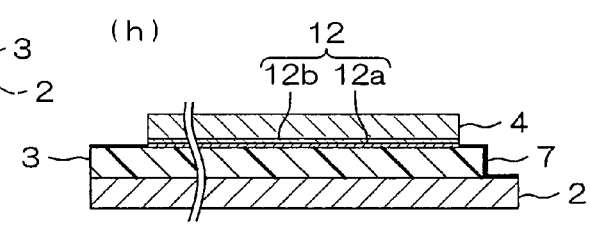
Figure 7:
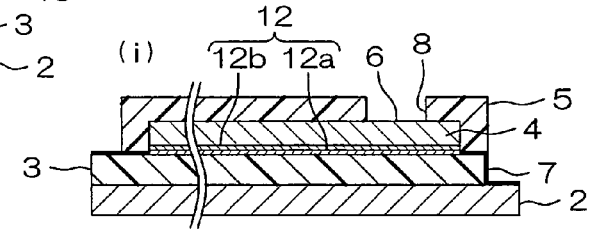
Figure 7:
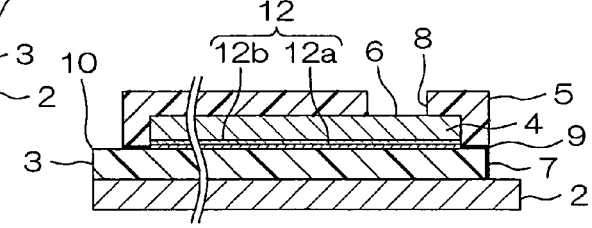
Figure 7:
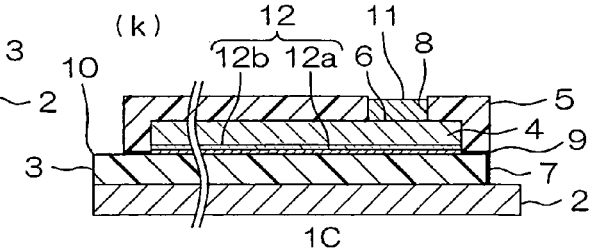

In addition, the production method of the suspension board with circuit 1C shown in FIG. 7 can produce the suspension board with circuit 1C just described in a simple manner and with efficiency.

Although the suspension board with circuit 1A is illustrated as an example of the wired circuit board of the present invention, the wired circuit board of the present invention includes a single sided flexible wired circuit board wherein the metal supporting board is provided as a stiffening layer, a double sided flexible wired circuit board, and a multilayer flexible wired circuit board.

EXAMPLES

While in the following, the present invention will be described in further detail with reference to Examples, the present invention is not limited to any of the examples.

Example 1

A metal supporting board of a stainless foil of 25 μm thick was prepared (Cf. FIG. 3(a)). Then, a varnish of photosensitive polyamic acid resin was coated over an upper surface of the metal supporting board. After dried, the coated varnish was exposed to light through a photo mask and then heated. Thereafter, the coat was developed, to form on the metal supporting layer such a pattern wherein an outer peripheral edge portion of the upper surface of the metal supporting board was partly exposed. Thereafter, the coat thus patterned was cured by the application of heat, to form the insulating base layer of polyimide resin having a thickness of 10 μm (Cf. FIG. 3(b)).

Then, the conductive pattern of copper of 10 μm thick was formed on the upper surface of the insulating base layer by the additive process in the form of the wired circuit pattern wherein the terminal portion and the wires are integrally formed (Cf. FIG. 3(c)).

Thereafter, the sputtering coat of a thin chromium film was formed in succession on the upper surface and lateral side surface of the conductive pattern, on the upper surface and lateral side surface of the insulating base layer exposed from the conductive pattern, and on the upper surface of the metal supporting board exposed from the insulating base layer by a sputtering process using chromium as a target.

The sputtering was conducted in the following conditions in the same manner as in the above.

| | |
|---|---|
| Target: | Cr |
| Ultimate vacuum: | $1.33 \times 10^{-3}$ Pa |
| Flow rate of introduced gas (Argon): | $2.0 \times 10^{-3}$ m$^3$/h |
| Operating pressure: | 0.16 Pa |
| Temperature of earth electrode: | 20. |
| Electric power: | DC180 W |
| Sputtering time: | Four seconds |
| Thickness of sputtering coat: | 0.01 μm |

Then, the surface of the sputtering coat of thin chromium film was oxidized by heating at 125. for 12 hours in the atmosphere, whereby the metal oxide layer of the chromium oxide layer was formed (Cf. FIG. 3(d)).

The presence of the metal oxide layer was confirmed by ESCA. When a value of surface resistance of the metal oxide layer thus formed was measured at a temperature of 25. and a humidity of 15% using a surface resistance measuring device (Hiresta-up MCP-HT450 available from Mitsubishi Chemical Corporation), it was $1 \times 10^9$./..

Thereafter, a varnish of photosensitive polyamic acid resin was coated over the semi-conductive layer which was formed on an upper surface and a lateral side surface of conductive pattern, on an upper surface and a lateral side surface of the insulating base layer exposed from the conductive pattern and on the upper surface of the metal supporting board, respectively. After dried, the coated varnish was exposed to light through the photo mask and then heated. Thereafter, the coat was developed and cured by the application of heat. As a result of this, the insulating cover layer of polyimide resin of 5 μm thick for covering the semi-conductive layer formed on the upper surface and lateral side surface of the conductive pattern was formed on the surface of the semi-conductive layer formed on the upper surface of the insulating base layer (FIG. 3(e)).

This insulating cover layer was formed on the surface of the semi-conductive layer formed on the upper surface of the conductive pattern in such a manner that an opening from which the semi-conductive layer was exposed was formed at a location corresponding to the terminal portions.

The insulating cover layer was formed on a continuous part of the semi-conductive layer formed on the upper surface of the insulating base layer to the semi-conductive layer formed on the lateral side surface of the insulating base layer, as well.

Thereafter, the semi-conductive layer exposed from the opening of the insulating cover layer, the semi-conductive layer formed on the upper surface of the insulating base layer exposed from the insulating cover layer, and the semi-conductive layer formed on the upper surface of the metal supporting board were etched (Cf. FIG. 3(f)).

In the etching process, after an etching resist was placed to cover the entire surface of the semi-conductive layer other than the surfaces thereof just described, the semi-conductive layer was etched at 30. for three minutes by wet etching using a mixed solution of potassium ferricyanide and sodium hydroxide as the etching solution. In this etching process, the semi-conductive layer was etched so that the semi-conductor layer formed on the lateral side surface of the insulating base layer could remain.

Thereafter, a metal plating layer of nickel and gold of 2.0 μm thick was formed on a surface of the terminal portion by electroless nickel plating and electroless gold plating. Then, the metal supporting board was cut out by chemical etching to form a gimbal and then trimmed. The suspension board with circuit was produced by the processes mentioned above.

The suspension board with circuit thus obtained corresponds to the suspension board with circuit 1A shown in FIG. 2 in that the semi-conductive layer is formed in succession on the lateral side surface and upper surface of the conductive pattern and on the upper surface and lateral side surface of the insulating base layer, and the semi-conductive layer formed on the lateral side surface of the insulating base layer contacts with the upper surface of the metal supporting board at a lower end thereof.

When a quantity of electric charge on the terminal portion of the suspension board with circuit thus produced was measured using a coulobm meter (NK-1001 available from Kasuga Electric Works Ltd.), it was 0nQ.

Example 2

A metal supporting board of a stainless foil of 25 μm thick was prepared (Cf. FIG. 7(a)). Then, a varnish of photosensitive polyamic acid resin was coated over an upper surface of the metal supporting board. After dried, the coated varnish was exposed to light through a photo mask and then heated. Thereafter, the coat was developed, to form on the metal supporting layer a pattern wherein an outer peripheral edge portion of the upper surface of the metal supporting board was partly exposed. Thereafter, the coat thus patterned was cured by the application of heat, to form the insulating base layer of polyimide resin having a thickness of 10 μm (Cf. FIG. 7(b)).

Thereafter, a thin conductive film comprising a thin chromium film of 150 Å thick and a thin copper film of 700 Å thick, which were laminated sequentially by being subjected to a successive sputtering of a chromium sputtering and a copper sputtering, was formed in succession on the upper surface and lateral side surface of the insulating base layer and on the upper surface of the metal supporting board exposed from the insulating base layer (Cf. FIG. 7(c)).

The successive sputtering was conducted in the following conditions.

| Target: | Cr/Cu |
|---|---|
| Ultimate vacuum: | $1.33 \times 10^{-3}$ Pa |
| Flow rate of introduced gas (Argon): | $2.0 \times 10^{-3}$ m$^3$/h |
| Operating pressure: | 0.16 Pa |
| Temperature of earth electrode: | 20. |
| Electric power: | DC180 W |
| Sputtering time: | Four seconds |

Then, a plating resist of a reverse pattern to the wired circuit pattern was formed from a dry film resist (Cf. FIG. 7(d)). Then, the conductive pattern of 10 μm thick was formed on the surface of the thin conductive film exposed from the plating resist in the form of the wired circuit pattern in which the terminal portion and the wires were integrally formed, by electrolytic copper plating (Cf. FIG. 7(e)).

Thereafter, the plating resist was removed by stripping (FIG. 7(f)). Thereafter, the thin copper film exposed from the conductive pattern was removed by etching so that the thin chromium film could remain (Cf. FIG. 7(g)). The thin copper film was etched at 30. for 20 seconds by wet etching using a mixed solution of nitric acid solution and hydrogen peroxide solution as the etching solution.

Thereafter, the thin chromium film exposed by the removal of the thin copper film was heated at 120. for 12 hours in the atmosphere so that a surface of the thin chromium film could be oxidized, to thereby form the metal oxide layer of a chromium oxide layer (Cf. FIG. 7(h)).

The presence of the metal oxide layer was confirmed by ESCA. When a value of surface resistance of the metal oxide layer thus formed was measured at a temperature of 25. and a humidity of 15% using the surface resistance measuring device (Hiresta-up MCP-HT450 available from Mitsubishi Chemical Corporation), it was $1.0 \times 10^8$./..

Thereafter, a varnish of photosensitive polyamic acid resin was coated over the semi-conductive layer which was formed on an upper surface and a lateral side surface of the conductive pattern, on an upper surface and a lateral side surface of the insulating base layer exposed from the conductive pattern and on the upper surface of the metal supporting board, respectively. After dried, the coated varnish was exposed to light through the photo mask and then heated. Thereafter, the coat was developed and cured by the application of heat. As a result of this, the insulating cover layer of polyimide resin of 5 μm thick for covering the upper surface and lateral side surface of the conductive pattern was formed on the surface of the semi-conductive layer formed on the upper surface of the insulating base layer (Cf. FIG. 7(i)).

The insulating cover layer was formed on the upper surface of the conductive pattern in such a manner that the opening from which the conductive pattern was exposed was formed at a location corresponding to the terminal portions.

Also, the insulating cover layer was formed so that it could be laminated on the continuous part of the semi-conductive layer formed on the upper surface of the insulating base layer to the semi-conductive layer formed on the lateral side surface of the insulating base layer, as well.

Thereafter, the semi-conductive layer formed on the upper surface of the insulating base layer exposed from the insulating cover layer, and the semi-conductive layer formed on the upper surface of the metal supporting board were etched (Cf. FIG. 7(j)).

In the etching process, after an etching resist was placed to cover the entire surface of the semi-conductive layer other than the surfaces thereof just described, the semi-conductive layer was etched at 30. for three minutes by wet etching using a mixed solution of potassium ferricyanide and sodium hydroxide as the etching solution. In this etching process, the semi-conductive layer was etched so that the semi-conductor layer formed on the lateral side surface of the insulating base layer could remain.

Thereafter, a metal plating layer of nickel and gold of 2.0 µm thick was formed on a surface of the terminal portion by electroless nickel plating and electroless gold plating. Then, the metal supporting board was cut out by chemical etching to form a gimbal and then trimmed. The suspension board with circuit was produced by the processes mentioned above (Cf. FIG. 7($k$)).

The suspension board with circuit thus obtained corresponds to the suspension board with circuit 1C shown in FIG. 6 in that the semi-conductive layer is formed on the upper surface of the insulating base layer exposed from the conductive pattern to contact with the lateral side surface of the conductive pattern, and the semi-conductive layer formed on the lateral side surface of the insulating base layer contacts with the upper surface of the metal supporting board at a lower end thereof.

When a quantity of electric charge on the terminal portion of the suspension board with circuit thus produced was measured using a coulobm meter (NK-1001 available from Kasuga Electric Works Ltd.), it was 0nQ.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A wired circuit board comprising:
   a metal supporting board,
   an insulating base layer formed on the metal supporting board,
   a conductive pattern formed on the insulating base layer,
   a semi-conductive layer which is formed on the insulating base layer exposed from the conductive pattern and at least a part of which contacts with the metal supporting board and the conductive pattern,
   an insulating cover layer, formed on the semi-conductive layer formed on the insulating base layer, to cover the conductive pattern, and
   a terminal portion formed by the conductive pattern exposed from an opening formed in the insulating cover layer,
   wherein static electricity is removed from the insulating base layer, the insulating cover layer and the terminal portion of the conductive pattern via the semi-conductive layer,
   wherein the insulating base layer is made of a polyimide resin,
   wherein the semi-conductive layer is a metal oxide layer having a thickness in the range of 10-100 nm, and
   wherein the semi-conductive layer formed on the insulating base layer is covered with the insulating cover layer, whereby the semi-conductive layer is prevented from being stripped.

2. The wired circuit board according to claim 1, wherein the semi-conductive layer is formed to cover an upper surface and a lateral side surface of the conductive pattern.

\* \* \* \* \*